US007285837B2

(12) United States Patent
Huang et al.

(10) Patent No.: US 7,285,837 B2
(45) Date of Patent: Oct. 23, 2007

(54) ELECTROSTATIC DISCHARGE DEVICE INTEGRATED WITH PAD

(75) Inventors: Chih-Feng Huang, Hsinchu County (TW); Tuo-Hsin Chien, Taipei (TW); Jenn-yu G. Lin, Taipei (TW); Ta-yung Yang, Milpitas, CA (US)

(73) Assignee: System General Corp., Taipei Hsien (TW)

( * ) Notice: Subject to any disclaimer, the term of this patent is extended or adjusted under 35 U.S.C. 154(b) by 0 days.

(21) Appl. No.: 10/905,677

(22) Filed: Jan. 17, 2005

(65) Prior Publication Data

US 2006/0157790 A1    Jul. 20, 2006

(51) Int. Cl.
*H01L 23/58* (2006.01)
(52) U.S. Cl. .................. 257/492; 257/355; 257/356; 257/357; 257/358; 257/370; 257/378

(58) Field of Classification Search ........ 257/355–358, 257/256, 370, 378
See application file for complete search history.

(56) References Cited

U.S. PATENT DOCUMENTS

| 5,828,119 | A  | * | 10/1998 | Katsube ..................... 257/491 |
| 6,266,222 | B1 | * | 7/2001  | Colombo et al. ........... 361/111 |
| 2005/0133869 | A1 | * | 6/2005 | Ker et al. .................... 257/355 |

* cited by examiner

*Primary Examiner*—Zandra V. Smith
*Assistant Examiner*—Tsz K. Chiu
(74) *Attorney, Agent, or Firm*—Jianq Chyun IP Offices

(57) ABSTRACT

A structure of an electrostatic discharge (ESD) device integrated with a pad is provided. The ESD device is integrated with the pad and formed under the pad. By using the area under the pad, the ESD device does not occupy additional space of an integrated circuit. Furthermore, since the pad is a large, plate, and ideal conductor, the connected pad and the ESD device are capable of distributing current in the ESD device averagely.

16 Claims, 2 Drawing Sheets

ELECTROSTATIC DISCHARGE DEVICE INTEGRATED WITH PAD

FILED OF THE INVENTION

The present invention relates to an electrostatic discharge (ESD) device and more particularly, to an ESD device integrated with pad.

BACKGROUND OF THE INVENTION

ESD devices have been widely used in integrated circuits to prevent damages from electrostatic voltage. Generally, the ESD devices occupy substantial space in an integrated circuit, which increases the manufacturing cost. Furthermore, conventional ESD devices are generally located near the pads horizontally. The dimension of the ESD devices is generally large and the current flowing characteristic of the conducting wire, such as metal, is not ideal. This could causes that the current flowing through the ESD device is not average. Moreover, this may affect the electric character and reduce breakdown endurance of the ESD device.

Therefore, an ESD device with reduced essential space and improved electric character is desired.

SUMMARY OF THE INVENTION

According to one aspect of the invention, an ESD device is integrated with a pad. Based on in-between voltage variation of complementary polar region, the ESD device can protect an integrated circuit from being damaged by electrostatic voltage.

According to another aspect of the invention, an ESD device is integrated with the pad and formed under the pad. By using the area under the pad, the ESD device does not occupy additional space of the integrated circuit.

According to another aspect of the invention, an ESD device is integrated with the pad and formed under the pad. Since the pad is a large and plate conductor, the connected pad and the ESD device can distribute the current in the ESD device averagely.

BRIEF DESCRIPTION OF THE DRAWINGS

These and other objects, features and advantages of the present invention will become apparent to those skilled in the art upon consideration of the following description of the embodiments of the present invention taken in conjunction with the accompanying drawings.

DETAILED DESCRIPTION OF THE INVENTION

Reference will now be made in detail to exemplary implementations, which are illustrated in the accompanying drawings. Wherever possible, the same reference numbers will be used throughout the drawings to refer to the same or like parts.

The following examples and implementations overcome the disadvantages of the conventional ESD devices and are able to reduce the size and cost of the integrated circuit. According to one example, ESD devices are formed under a pad, and connected to the pad with metal. Since the pad is a conductor, the current flowing from the pad to the ESD devices is well distributed, which improves the performance of ESD devices.

To form the ESD devices under the pad saves the cost and substantial die space in IC manufacturing. The ESD devices make use of in-between voltage variation of complementary polar region. In other words, the ESD devices can prevent damages from electrostatic voltage by breakdown mechanism between N-type doping region and P-type substrate or, in another example, P-type doping region and N-well.

Figure 1:
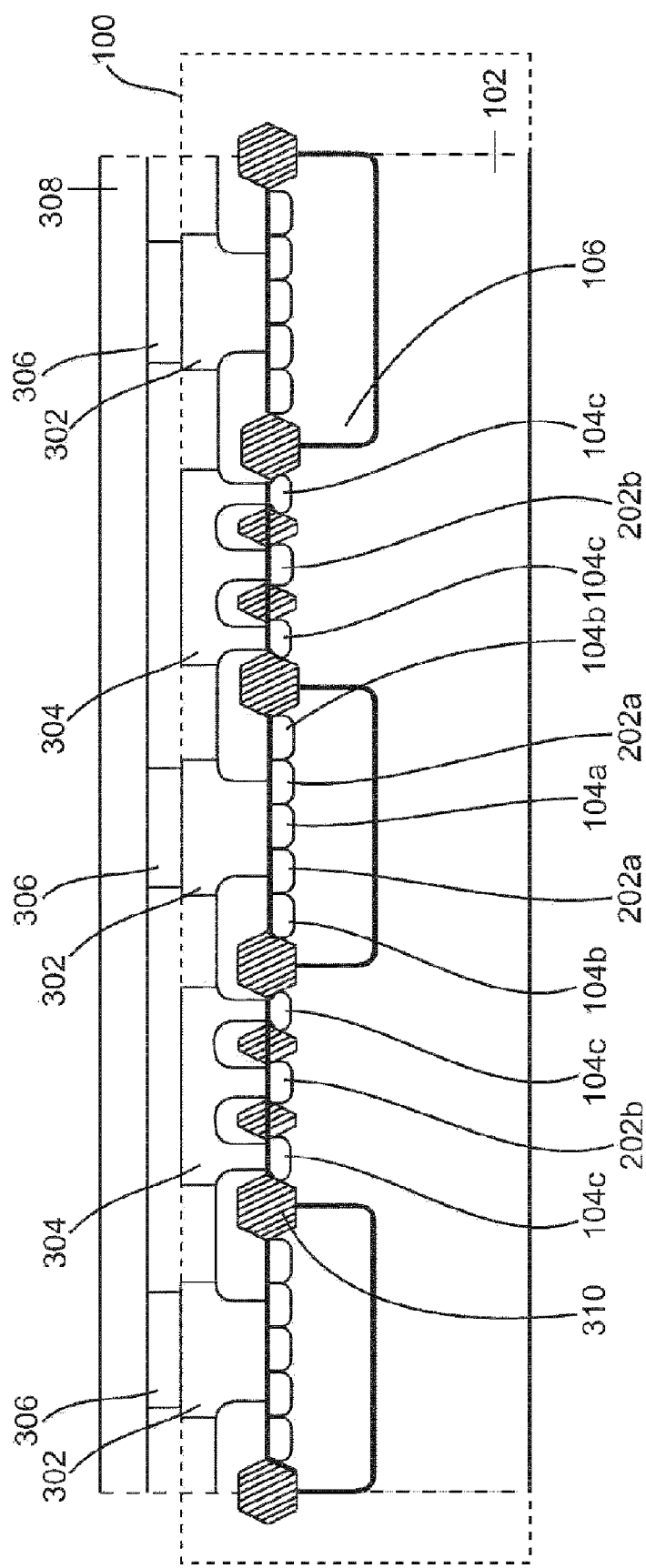
FIG. 1 shows a cross-sectional diagram according to one embodiment of the present invention.

FIG. 1 illustrates a cross-sectional view diagram of an ESD device 100 integrated with a pad metal layer 308 in one embodiment of the present invention. The ESD device 100 uses in-between voltage variation of an N-well 106, an N+ region 104b and a P-type substrate 102 to form a junction breakdown mechanism. When electrostatic voltage reaches a predetermined value, the ESD device 100 discharges the electrostatic voltage via the junction breakdown mechanism to protect the integrated circuit.

The ESD device 100 includes an anode 302 and a cathode 304. The anode 302 is directly connected to the pad metal layer 308 with a via 306. This makes the connection between the ESD device 100 and the pad metal layer 308. The anode 302 connects an N+ region 104a and two P+ regions 202a together. The cathode 304 connects two N+ regions 104c and a P+ region 202b together. A field oxide layer 310 serves as an isolation structure between the N+ region 104b and the N region 104c.

The ESD device 100 does not need extra mask of a standard CMOS process or similar process. Generally, area under the pad is spacious enough to contain the ESD device 100. Moreover, this ESD device structure may be poly-free and the structure combining an ESD device and a pad is also suitable in complementary process.

Figure 2:
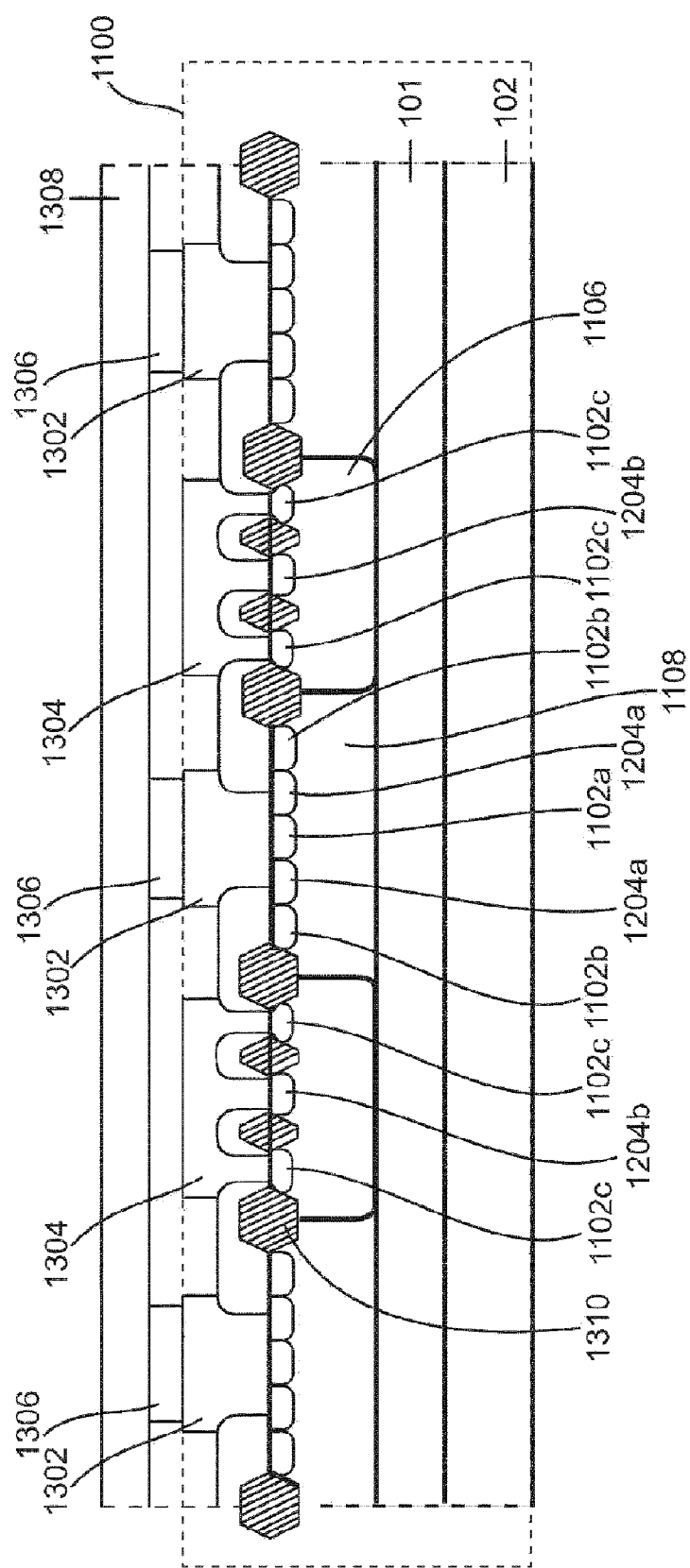
FIG. 2 shows a cross-sectional diagram according to another embodiment of the present invention.

FIG. 2 shows a cross-sectional view diagram of an ESD device 1100 integrated with a pad metal layer 1308 in another embodiment of the present invention. The ESD device 1100 also has a P-type substrate 102. The ESD device 1100 further includes an NBL (N-type Buried layer) 101 formed in the P-type substrate 102. An anode comprises an N+ region 1204b and two P+ regions 1102c. A cathode comprises two N+ regions 1204a and a P+ region 1102a. The cathode is connected to a pad metal layer 1308 by a via 1306.

The ESD device 1100 mainly uses in-between voltage variation of a P-well 1108, a P+ region 1102b and an N-well 1106 to form a junction breakdown mechanism. A field oxide layer 1310 serves as an isolation structure between the P+ region 1102b and the P+ region 1102c. When the electrostatic voltage reaches a predetermined value, the ESD device 1100 discharges the electrostatic voltage via the junction breakdown mechanism to protection the integrated circuit.

While embodiments of the present invention are illustrated and described, various modification and improvement can be made by those skilled in the art. The embodiment of the present invention is therefore described in an illustrative but not restrictive sense. It is intended that the present invention may not be limited to the particular forms as illustrated. And all the modification maintaining the spirit and realm of the present invention are within the scope as defined in the appended claims.

What is claimed is:

1. A structure of an electrostatic discharge device integrated with a pad, said structure comprising:
   a P-type substrate;
   an N-well, formed in said P-type substrate as a part of said electrostatic discharge device;
   at least one first N+ region formed outside said N-well, said first N+ region being isolated from said N-well and regions herein, and other doped regions in said P-type substrate by field oxides;
   at least one first P+ region formed outside said N-well, said first P+ region being isolated from said N-well and regions herein, other doped regions in said P-type substrate, and said first N+ region by field oxides;
   at least one second N+ region formed inside said N-well;
   at least one second P+ region formed inside said N-well, wherein said second N+ region and said second P+ region are formed next to each other;
   a first electrode, connecting at least one second N+ region and at least one second P+ region via an electric conductor, which comprises metal; and
   a second electrode, connecting said first P+ region and said first N+ region via another electric conductor, which comprises metal, wherein the structure of said electrostatic discharge device is formed under an area of said pad and covered by said pad.

2. The structure as claimed in claim 1, wherein said pad is integrated with said structure for average current distribution.

3. The structure as claimed in claim 1, wherein said pad is integrated with said structure to eliminate an essential space for said electrostatic discharge device.

4. A structure of an electrostatic discharge device integrated with a pad, said structure comprising:
   a P-type substrate;
   an N-type buried layer, formed in said P-type substrate;
   an N-well, formed on said N buried layer as a part of said electrostatic discharge device;
   a P-well formed on said N buried layer next to said N-well;
   at least one third N+ region formed inside said N-well, said third N+ region being isolated from said P-well and regions herein, and other doped regions in said N-well by field oxides;
   at least one third P+ region formed inside said N-well, said third P+ region being isolated from said P-well and regions herein, other doped regions lit said N-well, and said third N+ region by field oxides;
   at least one fourth N+ region formed inside said P-well;
   at least one fourth P+ region formed inside said P-well, wherein said fourth N+ region and said fourth P+ region are formed next to each other;
   a first electrode, connecting at least one fourth N+ region and at least one fourth P+ region; and
   a second electrode, connecting said third P+ region and said third N+ region, wherein the structure of said electrostatic discharge device is formed under an area of said pad and covered by said pad.

5. The structure as claimed in claim 4, wherein said pad is integrated with said structure for average current distribution.

6. The structure as claimed in claim 4, wherein said pad is integrated with said structure to eliminate an essential space for said electrostatic discharge device.

7. A structure of an electrostatic discharge device, comprising:
   a P-type substrate;
   at least one N-well, formed in the P-type substrate;
   at least one first N+ region, formed outside the N+-well and isolated from the N-well;
   at least one first P+ region, formed outside the N-well and isolated from the first N+ region and the N-well;
   at least one second N+ region, formed inside the N-well;
   at least one second P+ region, formed inside the N-well;
   a first electrode, disposed over the N-well and connecting at least one second N+ region and at least one second P+ region;
   a second electrode, disposed outside the N-well and connecting at least one first P+ region and at least one first N+ region; and
   a pad, disposed over the first electrode and the second electrode, and connecting the first electrode and the second electrode.

8. The structure as claimed in claim 7, wherein the second N+ region and the second P+ region are formed next to each other.

9. The structure as claimed in claim 7, further comprising:
   a plurality of first field oxides, disposed on the P-type substrate for isolating the first N+ region and the first P+ region from the N-well; and
   a plurality of second field oxides, disposed on the P-type substrate for isolating the first N+ region from the first P+ region.

10. The structure as claimed in claim 7, wherein the first electrode or the second electrode is made of metal.

11. The structure as claimed in claim 7, further comprising:
    at least one first via, connected between the first electrode and the pad; and
    at least one second via, connected between the second electrode and the pad.

12. A structure of an electrostatic discharge device, comprising:
    a P-type substrate;
    an N-type buried layer, formed in the P-type substrate;
    at least one N-well, formed in the P-type substrate and on the N buried layer;
    at least one P-well, formed in the P-type substrate and on said N buried layer, wherein the P-well is next to the N-well;
    at least one third N+ region, formed inside the N-well and isolated from the P-well;
    at least one third P+ region, formed inside the N+-well and isolated from the P-well;
    at least one fourth N+ region, formed inside the P-well;
    at least one fourth P+ region, formed inside the P-well;
    a first electrode, disposed over the P-well and connecting at least one fourth N+ region and at least one fourth P+ region;
    a second electrode, disposed over the N-well and connecting at least one third P+ region and at least one third N+ region; and
    a pad, disposed over the first electrode and the second electrode, and connecting the first electrode and the second electrode.

13. The structure as claimed in claim 12, wherein the fourth N+ region and the fourth P+ region are formed next to each other.

14. The structure as claimed in claim 12, further comprising:

a plurality of first field oxides, disposed on the P-type substrate For isolating the third N+ region and the third P+ region from the N-well; and a plurality of second field oxides disposed on the P-type substrate for isolating the third N+ region from the third P+ region.

15. The structure as claimed in claim 12, wherein the first electrode or the second electrode is made of metal.

16. The structure as claimed in claim 12, further comprising:

at least one first via, connected between the first electrode and the pad; and at least one second via, connected between the second electrode and the pad.

* * * * *